United States Patent [19]
Takano et al.

[11] Patent Number: 5,462,010
[45] Date of Patent: Oct. 31, 1995

[54] APPARATUS FOR SUPPLYING GRANULAR RAW MATERIAL FOR A SEMICONDUCTOR SINGLE CRYSTAL PULLING APPARATUS

[75] Inventors: Kiyotaka Takano; Izumi Fusegawa; Hirotoshi Yamagishi; Koji Mizuishi; Katsuhiko Ogino, all of Gunma, Japan

[73] Assignee: Shin-Etsu Handotai Co., Ltd., Japan

[21] Appl. No.: 961,182

[22] Filed: Oct. 14, 1992

[30] Foreign Application Priority Data

Oct. 15, 1991 [JP] Japan .................... 3-293808

[51] Int. Cl.⁶ .................................................. C30B 15/02
[52] U.S. Cl. .................. 117/14; 117/33; 117/214
[58] Field of Search .............. 117/14, 33, 201, 117/202, 214, 218

[56] References Cited

U.S. PATENT DOCUMENTS

| | | | |
|---|---|---|---|
| 3,768,628 | 10/1973 | Bross | 198/54 |
| 3,998,686 | 12/1976 | Meiling et al. | 117/33 |
| 4,002,274 | 1/1977 | Rice | 117/214 |
| 4,849,175 | 7/1989 | Dupain et al. | 422/63 |
| 5,229,082 | 7/1993 | Seidensticker et al. | 117/214 |

FOREIGN PATENT DOCUMENTS 5105575  4/1993  Japan.

*Primary Examiner*—R. Bruce Breneman
*Assistant Examiner*—Felisa Garrett
*Attorney, Agent, or Firm*—Whitham, Curtis, Whitham & McGinn

[57] ABSTRACT

An apparatus for continuously supplying granular polycrystal silicon to a crucible of a semiconductor single crystal pulling apparatus, comprising a funnel-shaped tank having a relatively large capacity, a main hopper having a relatively small capacity and weight, a subhopper having an intermediate capacity and weight and providing a passage from said tank to said main hopper, and a weight sensor for detecting the weight of the main hopper, wherein the overall weight of the main hopper is measured to obtain the flow rate (supply rate) of the granular polycrystal silicon.

10 Claims, 2 Drawing Sheets

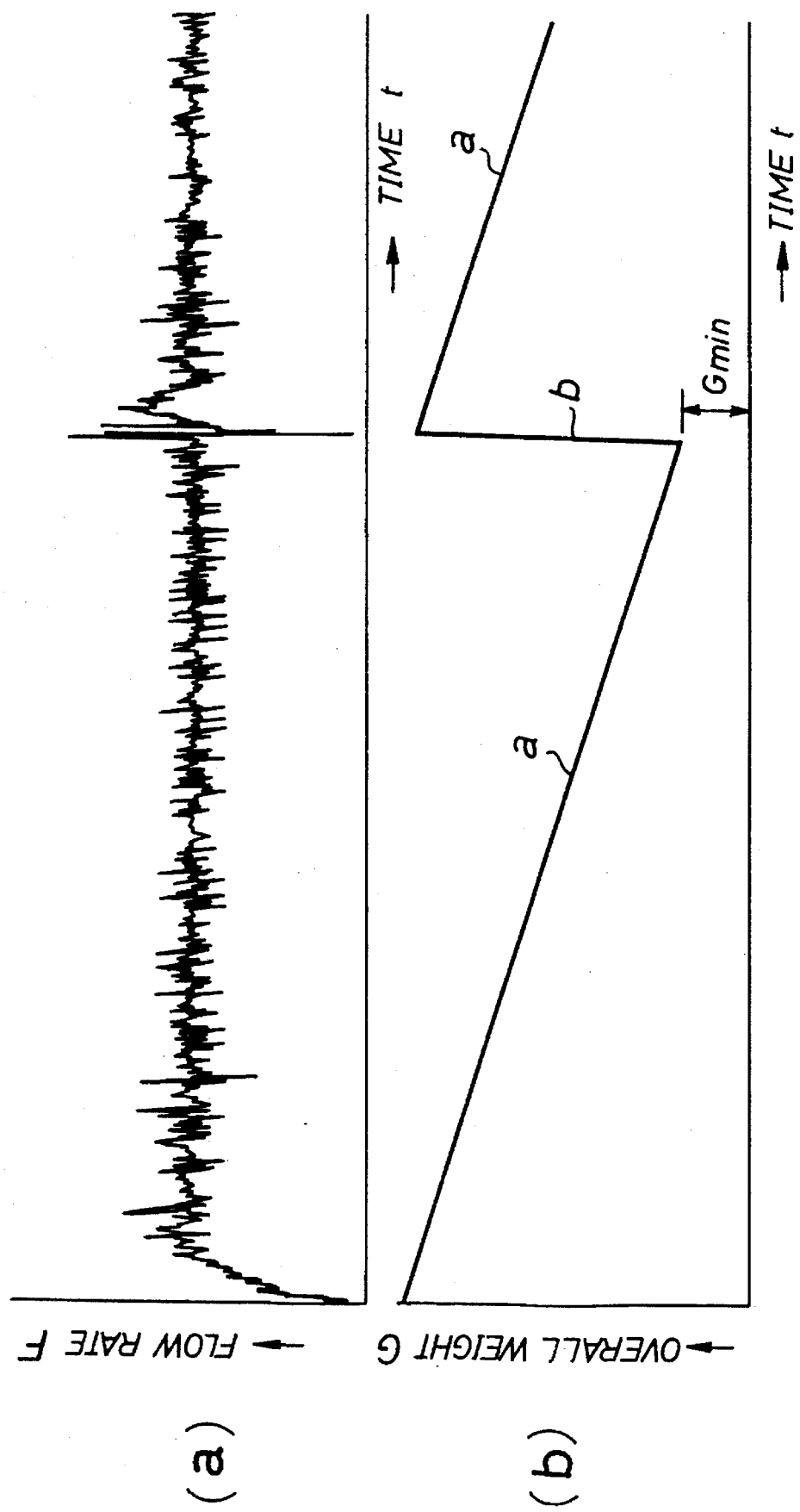

APPARATUS FOR SUPPLYING GRANULAR RAW MATERIAL FOR A SEMICONDUCTOR SINGLE CRYSTAL PULLING APPARATUS

BACKGROUND OF THE INVENTION

The present invention relates to an apparatus for continuously and continually supplying granular raw material, such as polycrystal silicon, to a crucible installed in a semiconductor single crystal pulling apparatus.

DESCRIPTION OF THE PRIOR ART

In a conventional method of manufacturing a semiconductor single crystal, such as silicon single crystal, in accordance with Czochralski (CZ) method, polycrystal silicon lumps (raw material) broken to appropriate sizes are charged into the crucible installed in the single crystal pulling apparatus, and then the polycrystal silicon lumps are heated and melted in the crucible by means of resistance heating or high-frequency heating, and a seed crystal connected to the lower end of a pulling means is dipped in the surface of the molten liquid (melt), and while slowly turning the pulling means about the vertical axis, the pulling means is raised at a rate of several millimeters per minute whereby a silicon single crystal is grown from the tip of the seed crystal.

However, in the above manufacturing process, since the furnace (chamber) as well as the crucible must be cooled each time a new charge of polycrystal silicon lumps is supplied to the crucible, the number of single crystal ingots raised per fixed time is so small that it is difficult to improve the production efficiency, and the risk of breakage of the expensive crucible is relatively high due to the difference in thermal expansion coefficient between the crucible and the semiconductor substance. Therefore, it has been practiced alternatively that granular polycrystal silicon is supplied continuously to the crucible during each pulling operation to render it unnecessary for the furnace temperature to be lowered (continual charging method). For this purpose various apparatuses for supplying the granular polycrystal material were proposed (for example, Japanese Patent Applications Kokai 59-115736 and Kokai 61-36197). In these apparatuses, the supply rate is controlled responsive to the measured weight of the granular polycrystal material.

PROBLEMS THE INVENTION SEEKS TO SOLVE

However, in the conventional apparatuses for supplying granular polycrystal material, since the overall weight of a large-sized hopper containing a large amount of the granular polycrystal material was measured, it was necessary to use a weight-measuring machine adapted for measuring relatively heavy matters so that the sensitivity of the weight-measuring machine was relatively low; as the result, it was not possible to control the supply rate of the polycrystal material with sufficiently high precision. For example, in the case of adopting a control system whereby the melt weight in the crucible is maintained at a constant level, if the supply rate of the polycrystal material cannot be controlled accurately, it becomes difficult to maintain the melt weight at a constant level, and consequently the oxygen concentration in the single crystal varies with growth, and in the case of adopting a control system whereby the melt weight is reduced with the growth of the single crystal so as to maintain the dopant concentration of the melt at a constant level, if the supply rate of the polycrystal material is not precisely controlled, the dopant concentration cannot be accurately maintained at the desired level, either.

Also, in the CZ method, it is often practiced that the single crystal growing rate and the heater power are varied in a manner such that the diameter of the grown single crystal is maintained uniform; however, in order to maintain the melt weight at a constant level in the continual charging method, or in order to maintain the dopant concentration of the melt at a fixed level, it was necessary to continually vary the polycrystal silicon supply rate in response to the growing rate and the diameter of the single crystal ingot. For this reason, if the sensitivity of the weight-measuring machine is not sufficiently high, the controlling of the polycrystal silicon supply rate cannot accurately catch up with the undesirable changing in growing rate and diameter of the single crystal ingot so that it becomes impossible to maintain either the melt weight nor the dopant concentration of the melt.

The present invention was contrived in view of the above problems, and it is, therefore, an object of the invention to provide an apparatus for continuously supplying granular raw material, such as polycrystal silicon, to a crucible installed in a semiconductor single crystal pulling apparatus, which supplying apparatus is capable of controlling the supply rate of the granular raw material with high precision and high stability in a manner such that it is possible to maintain the melt amount in the crucible or the dopant concentration in the melt at a fixed level.

MEANS TO SOLVE THE PROBLEMS

In order to attain the above and other objects of the invention, there is provided an apparatus for continuously supplying granular raw material to a crucible installed in a semiconductor single crystal pulling apparatus, the supplying apparatus comprising a vacuum chamber, a funnel-shaped tank having a relatively large capacity, a main hopper installed below the tank and having a relatively small capacity, a vibration feeder on which the main hopper is mounted and which is adapted to vibrate the main hopper, a subhopper having an intermediate capacity and providing a passage from the tank to the main hopper and being equipped with at least one valve for closing and opening its outlet tube, a weight sensor for detecting the weight of the main hopper, a control means for controlling the operation of the vibration feeder in response to a detection signal received from the weight sensor, and a power source for supplying electric power.

According to another aspect of the invention, there is provided a method for continuously supplying granular raw material to a crucible installed in a semiconductor single crystal pulling apparatus, comprising the steps of: measuring the overall weight of the main hopper with the weight sensor, vibrating the main hopper with the vibration feeder to thereby cause the granular raw material to flow out of the main hopper, opening all of the at least one valve when the overall weight of the main hopper becomes lower than a predetermined threshold limit value to thereby supply the granular raw material to the main hopper from the subhopper.

EFFECTS

According to the invention, the weight of the main hopper installed separately from the large-sized tank is relatively small, so that it is possible to employ a high sensitive weight sensor for measuring the weight of the light main hopper and, accordingly, the change in the overall weight of the main hopper, that is, the flow rate of the granular raw material supplied by the main hopper 5 to the single crystal pulling apparatus, is obtained with high precision. Then, thus obtained flow rate (supply rate) of the granular raw material is inputted in the control means, and the control means controls the vibration feeder in a manner such that the supply rate of the granular raw material approaches the predetermined value.

As the result, it becomes possible to effect high precision and stable control of the supply of the granular raw material, which in turn makes it possible to maintain to a fixed level the melt amount in the crucible of the single crystal pulling apparatus or the dopant concentration of the melt; consequently a semiconductor single crystal material of high quality is obtained. Incidentally, when the weight of the main hopper (plus the granular raw material) measured by the weight sensor becomes smaller than a predetermined threshold limit value, the supply of the granular raw material to the main hopper from the tank is effected.

The above and other objects and features of the invention will appear more fully hereinafter in the following description given in connection with the accompanying drawings and the novelty thereof pointed out in the appended claims.

BRIEF DESCRIPTION OF THE DRAWINGS

FIG. 2 shows two graphs: (a) plotting the variation of the raw material supply rate with time; (b) plotting the variation of the overall weight of a main hopper with time.

EMBODIMENTS

Figure 1:
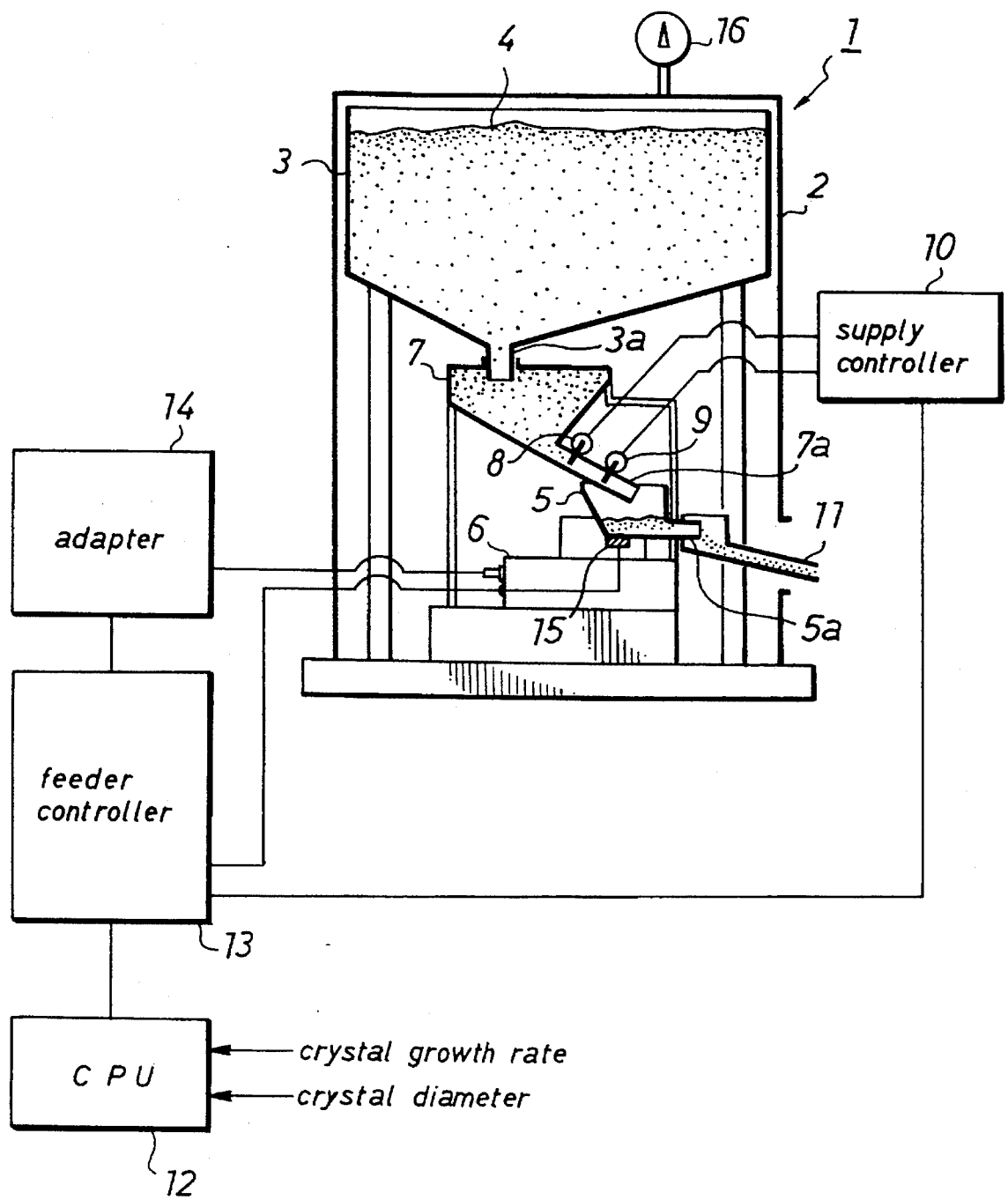
FIG. 1 is a schematic drawing showing the construction of an apparatus for continuously supplying granular raw material for a semiconductor single crystal pulling apparatus according to the invention.

Next, an embodiment of the invention, which is considered the best mode, will be described with reference to the attached drawings.

FIG. 1 is a schematic drawing showing the construction of an apparatus for continuously supplying granular raw material for a semiconductor single crystal pulling apparatus according to the invention. The granular raw material supply apparatus 1 comprises a vacuum chamber 2, and a funnel-shaped tank 3 having a relatively large capacity is installed inside the vacuum chamber 2 beneath the ceiling thereof. In the tank 3 is stored granular polycrystal silicon (hereinafter referred to as "polysilicon") 4.

Below the tank 2, a main hopper 5 having a relatively small capacity (150 cc, in this embodiment) is installed on a vibration feeder 6, and a subhopper 7 having an intermediate capacity (1350 cc, in this embodiment) is provided between the main hopper 5 and the tank 2. An outlet pipe 3a extending vertically from the sink of the tank 3 is disposed in the upper part of the subhopper 7, and an outlet pipe 7a extending obliquely from the sink of the subhopper 7 is disposed in the upper part of the main hopper 5. Two rotary solenoid valves 8 and 9 are installed in a row along the outlet pipe 7a, and these are electrically connected to a supply controller 10, which is installed separately from the vacuum chamber 2.

A trough 5a extending horizontally from the main hopper 5 is connected to a raw material supply pipe 11 made of quartz for supplying granular polysilicon 4 to a quartz crucible installed in the chamber of the single crystal pulling apparatus, not shown.

Provided apart from the vacuum chamber 2 are a CPU 12, a feeder controller 13, and an adaptor 14 as the power source, and these are electrically connected in series in this order, as shown in FIG. 1, and the feeder controller 13 is also electrically connected to the supply controller 10.

The vibration feeder 6 is electrically connected to the adaptor 14 so that the the vibration feeder 6 is energized by the adapter 14 and thereby imparts to the main hopper 5 a vibration of predetermined frequency and amplitude. The vibration feeder 6 is provided with a high sensitivity load cell 15 as a weight sensor for measuring the weight of the main hopper 5. This load cell 15 is electrically connected to the feeder controller 13 so that the load cell 15 is adapted to supply the feeder controller 13 with signals indicating the weight of the main hopper 5.

The vacuum chamber 2 constituting the granular raw material supply apparatus 1 is provided at a vacuum pump, not shown, and a vacuum meter 16, and the inside of the vacuum chamber 2 is kept vacuum. Therefore, it is possible to adapt the operation condition in the granular raw material supply apparatus 1 to be the same as that in the single crystal pulling apparatus by equating the vacuum degrees between the two apparatuses; hence it becomes possible to switch the connection of the granular raw material supply apparatus 1 from one single crystal pulling apparatus to another in the course of the single crystal pulling operations. Incidentally, a single crystal pulling apparatus is equipped with an isolation valve for isolating the intrachamber atmosphere from the external atmosphere and a port having a uniformization valve for uniformizing the pressure in the chamber, so that the granular raw material supply apparatus 1 is easily connected to a single crystal pulling apparatus by means of this port.

Also, in this embodiment, the inner walls of the tank 2, the main hopper 5 and the subhopper 7 as well as all the other surfaces with which the granular polysilicon 4 comes in contact as it passes are coated with Teflon so as to prevent the granular polysilicon 4 from being contaminated with the heavy metals, which will eventually impair the quality of the resulting single crystal silicon.

Next, the operation of the granular raw material supply apparatus 1 will be described.

As mentioned above, the outlet tube 3a of the tank 3 is disposed in the upper part of the subhopper 7 so that the subhopper 7 is always filled with the granular polysilicon 4 automatically supplied from the tank 2. Also, as will be described later, it is so arranged that when the residual amount of the granular polysilicon 4 in the main hopper 5 becomes smaller than a predetermined amount, the rotary solenoid valves 8 and 9 are opened to thereby allow the granular polysilicon 4 in the subhopper 7 to flow into the main hopper 5 for replenishment.

As already described, the main hopper is vibrated by the adaptor 14 so that the granular polysilicon 4 stored in the main hopper 5 is caused to flow out through the trough 5a and the raw material supply pipe 11 and eventually enters the quartz crucible installed in the chamber of the single crystal pulling apparatus, not shown. This charging of the granular polysilicon 4 into the quartz crucible can be conducted continuously as well as intermittently. Now, the overall weight of the main hopper 5 is measured by means of the load cell 15 at a frequency of 70 times per second, and each result of the measurement is supplied to the feed controller 13 in the form of electrical signals indicating the weight values. Incidentally, in the present embodiment, even though the trough 5a is so short as 5 cm in length, the granular polysilicon 4 does not fall into the raw material supply pipe 11 by its self weight, nor can a loop of vibration prevent smooth supply of the granular polysilicon 4.

In the CPU 12 are stored tables for mapping of values of single crystal growth rate and ingot diameter, so that when the CPU 12 receives signals indicating the values of single crystal growth rate and the ingot diameter, it calculates from these data the weight of the single crystal ingot and from this result it determines the set value for the supply rate (flow rate) of the granular polysilicon 4 and outputs a signal indicative of this set value to the feed controller 13. Thereupon, the feed controller 13 outputs a control signal in response to the determined set value to the adaptor 14, whereby the voltage of the adaptor 14 is adjusted and consequently the magnitude of the vibration imparted by the vibration feeder 6 to the main hopper 5 is altered in a manner such that the supply rate of the granular polysilicon 4 from the main hopper 5 becomes the set value. Incidentally, the CPU 12 is programmed with both of the control patterns: that is, for controlling the melt weight to a constant value, and for controlling the melt weight to decreasing values.

The weight of the granular polysilicon 4 itself in the main hopper 5 is obtained by subtracting the known weight of the main hopper 5 from the overall weight of the main hopper 5 as measured, and the supply rate (flow rate) of the granular polysilicon 4 is obtained by calculating the reduction in weight of the granular polysilicon 4 in the main hopper 5 per unit time. FIG. 2 (a) is a graph wherein the variation of the supply rate (flow rate) F of the granular polysilicon 4 is plotted with respect to time t in the case of a charging operation wherein the melt weight in the crucible is maintained at a constant level.

As the granular polysilicon 4 is shook out from the main hopper 5, the overall weight G of the main hopper 5 undergoes a gradual decrease with time t along the line a in the graph (b) of FIG. 2, and when the value G becomes smaller than a predetermined minimum value $G_{min}$, the feeder controller 13 outputs a certain signal to the supply controller 10, and upon receipt of this signal the supply controller 10 causes the rotary solenoid valves 8, 9 to open to thereby allow the granular polysilicon 4 in the subhopper 7 to slide down along the oblique outlet pipe 7a to be charged into the main hopper 5. On this occasion, the falling granular polysilicon 4 tends to scatter in all directions or spill over the main hopper 5; therefore, it is so arranged that at the start of supplying the granular polysilicon 4 the lower valve 9 is completely opened first and thereafter the upper valve 8 is opened so that the flowing granular polysilicon 4 is not disturbed by the half open solenoid valve 9, and that at the end of supplying the granular polysilicon 4 the upper valve 8 is completely closed first and then the lower valve 9 is closed.

The moment the granular polysilicon 4 is supplied to the main hopper 5 from the subhopper 7, the overall weight G of the main hopper 5 undergoes a sudden increase as shown by the nearly vertical line b in the graph (b) of FIG. 2, so that the apparent granular polysilicon supply rate (flow rate) becomes so absurd as to obstruct accurate controlling of the flow rate. Therefore, in the present embodiment, the data of the vibration amplitude of the vibration feeder 6 taken during the time when the granular raw material is not supplied to the maind hopper are stored, and during the time when the subhopper 7 supplies the granular polysilicon to the main hopper 5, the main hopper 5, which would not be vibrated at the moment since the apparent flow rate has become negative, is forced to vibrate by an amplitude equal to said stored amplitude, whereby the error in flow rate controlling caused by the sudden supply of the granular polysilicon to the main hopper 5 is minimized.

As described above, in the present embodiment, the main hopper 5 having a relatively small capacity and installed separately from the large-sized tank 3 has a relatively small weight; therefore, it is possible to employ a high sensitive load cell 15 as the weight sensor for measuring the weight of the light main hopper 5 and, accordingly, the change in the overall weight of the main hopper 5, that is, the flow rate of the granular polysilicon 4 supplied by the main hopper 5 to the single crystal pulling apparatus, is obtained with high precision. As the result, it becomes possible to effect high precision and stable control of the supply of the granular polysilicon 4, which in turn makes it possible to maintain to a fixed level the melt amount in the crucible of the single crystal pulling apparatus or the dopant concentration of the melt; consequently a single crystal silicon of high quality is obtained.

Obviously many modifications and variations of the present invention are possible in the light of the above teachings. It is therefore to be understood that within the scope of the appended claims the invention may be practiced otherwise than is specifically described.

What is claimed is:

1. An apparatus for continuously supplying granular raw material to a crucible installed in a semiconductor single crystal pulling apparatus, said supplying apparatus comprising a vacuum chamber, a funnel-shaped tank having a relatively large capacity, a main hopper installed below said tank and having a relatively small capacity, a vibration feeder on which said main hopper is mounted and which is adapted to vibrate said main hopper, a subhopper having an intermediate capacity and providing a passage from said tank to said main hopper and being equipped with at least one valve for closing and opening its outlet tube disposed in said main hopper, a weight sensor for detecting the weight of said main hopper, a control means for controlling the operation of said vibration feeder in response to a detection signal received from said weight sensor indicating the weight of said main hopper, and a power source for supplying electric power.

2. The supplying apparatus as claimed in claim 1 wherein said weight sensor is a load cell.

3. The supplying apparatus as claimed in claim 1 wherein said at least one valve is adapted to open when the overall weight of the main hopper becomes smaller than a threshold limit value to thereby supply the granular raw material to the main hopper from the subhopper.

4. The supplying apparatus as claimed in claim 3 wherein there are two valves for closing and opening the outlet tube of the subhopper.

5. The supplying apparatus as recited in claim 1, wherein at least inner walls of the tank, the main hopper and the subhopper with which the granular raw material comes in contact as it passes are coated with a coating means for prevention of contamination of said granular raw material.

6. The supplying apparatus as claimed in claim 1 wherein the tank, the subhopper, the main hopper, the vibration feeder, and the weight sensor are installed inside the vacuum chamber, and the control means and the power source are installed outside the vacuum chamber.

7. A method for continuously supplying granular raw material to a crucible installed in a semiconductor single crystal pulling apparatus, to be conducted in a supplying apparatus comprising a vacuum chamber, a funnel-shaped tank having a relatively large capacity, a main hopper installed below said tank and having a relatively small capacity, a vibration feeder on which said main hopper is mounted and which is adapted to vibrate said main hopper, a subhopper having an intermediate capacity and including an outlet tube, said subhopper providing a passage from said tank to said main hopper and being equipped with at least one valve for opening and closing said outlet tube, a weight sensor for detecting weight of said main hopper, a control means for controlling operation of said vibration feeder is response to a detection signal received from said weight sensor indicating weight of said main hopper, and a source of electrical power;

said method including the steps of: measuring the overall weight of said main hopper with said weight sensor, vibrating said main hopper with said vibration feeder to thereby cause said granular raw material to flow out of said main hopper, opening all of said at least one valve when the overall weight of the main hopper becomes smaller than a threshold limit value to thereby supply the granular raw material to the main hopper to the subhopper.

8. The method for continuously supplying raw material as claimed in claim 7 wherein there are two valves for closing and opening the outlet tube of the subhopper, said two valves including a first valve and a second valve, said first valve being upstream of said second valve in said outlet tube and said second valve being downstream of said first valve in said outlet tube, and at the start of supplying the granular raw material the second valve is completely opened first and thereafter the first valve is opened, and at the end of supplying the granular raw material the first valve is completely closed first and then the second valve is closed.

9. The method for continuously supplying granular raw material as claimed in claim 7 wherein, during the time when the granular raw material is supplied to said main hopper, said main hopper is vibrated by said vibration feeder at a vibration amplitude adopted during the time when said main hopper is kept unsupplied with the granular raw material.

10. The method for continuously supplying granular raw material as claimed in claim 7 wherein said control means determines the supply rate of the granular raw material in response to a current single crystal growth rate and ingot diameter.

\* \* \* \* \*